United States Patent
Zhang et al.

(10) Patent No.: US 12,424,482 B2
(45) Date of Patent: Sep. 23, 2025

(54) SELECTIVE IMPLANTATION INTO STI OF ETSOI DEVICE

(71) Applicant: Applied Materials, Inc., Santa Clara, CA (US)

(72) Inventors: Qintao Zhang, Mt Kisco, NY (US); Wei Zou, Lexington, MA (US)

(73) Assignee: Applied Materials, Inc.

(*) Notice: Subject to any disclaimer, the term of this patent is extended or adjusted under 35 U.S.C. 154(b) by 450 days.

(21) Appl. No.: 18/079,817

(22) Filed: Dec. 12, 2022

(65) Prior Publication Data

US 2024/0194518 A1  Jun. 13, 2024

(51) Int. Cl.
*H01L 21/762* (2006.01)
*H01L 21/3115* (2006.01)
*H10D 30/69* (2025.01)

(52) U.S. Cl.
CPC .. *H01L 21/76224* (2013.01); *H01L 21/31155* (2013.01)

(58) Field of Classification Search
CPC ......... H01L 21/76224; H01L 21/76283; H01L 21/31155; H01L 21/265; H01L 21/76237; H01L 21/3081; H01L 21/0274; H01L 21/266; H01L 21/3086; H01L 21/31144; H10D 30/795; H10D 84/0151; H10D 84/0191; H10D 84/929; H10D 84/931
See application file for complete search history.

(56) References Cited

U.S. PATENT DOCUMENTS

| | | | | |
|---|---|---|---|---|
| 8,829,642 B2* | 9/2014 | Yin | .................... | H01L 21/76232 438/436 |
| 2005/0217799 A1* | 10/2005 | O'Meara | ........... | H01L 21/67109 156/345.52 |
| 2009/0159981 A1* | 6/2009 | Niimi | ................. | H10D 84/0151 257/E21.546 |
| 2012/0302038 A1* | 11/2012 | Zheng | ................ | H10D 84/0188 438/433 |
| 2015/0118805 A1* | 4/2015 | Rideau | .............. | H01L 21/02532 438/433 |
| 2022/0037199 A1* | 2/2022 | Cheng | ............... | H01L 21/76283 |

OTHER PUBLICATIONS

Emmanuel Sabonnadiere, "Future Applications AI Withfdsoi", 6th Shanghai FDSOI FORUM, Sep. 18, 2018, 16 pages.
Gallon et al., "Electrical Analysis of Mechanical Stress Induced by STI in Short MOSFETs Using Externally Applied Stress", IEEE Transactions on Electron Devices, vol. 51, No. 8, Aug. 2004, pp. 1254-1261.

* cited by examiner

*Primary Examiner* — Sonya McCall-Shepard
(74) *Attorney, Agent, or Firm* — KDW Firm PLLC

(57) ABSTRACT

Disclosed herein are approaches for forming a shallow trench isolation (STI) to improve extremely thin silicon on insulator (ETSOI) device performance. In one approach, a method may include providing a device stack comprising a buried oxide (BOX) layer in a substrate, patterning a hardmask over the substrate, and forming a plurality of isolation regions in the device stack, wherein the plurality of isolation regions extend through the box layer and the substrate. The method may further include forming a well mask over the device stack, wherein an opening through the well mask exposes a first isolation region of the plurality of isolation regions, and modifying a stress of a material of the first isolation region by implanting the first isolation region of the plurality of isolation regions.

20 Claims, 5 Drawing Sheets

SELECTIVE IMPLANTATION INTO STI OF ETSOI DEVICE

FIELD OF THE DISCLOSURE

The present disclosure relates to semiconductor structures and, more particularly, to selective implantation into a shallow trench isolation (STI) to improve extremely thin silicon-on-insulator (ETSOI) device performance.

BACKGROUND OF THE DISCLOSURE

Semiconductor-on-insulator (SOI) technology allows the formation of high-speed, shallow junction devices. In addition, SOI devices improve performance by reducing parasitic junction capacitance. In an SOI substrate, a buried oxide (BOX) layer made of silicon oxide is formed on single crystal silicon, and a single crystal silicon thin film is formed thereupon. Various methods of fabricating such SOI substrates are known.

More recently, devices are formed on SOI substrates having an extremely thin semiconductor-on-insulator (ETSOI) layer. The ETSOI layer is formed on top of the of the SOI substrate, with a thickness sometimes ranging from 3 nm to 20 nm. Raised source and raised drains are typically formed on an upper surface of the ETSOI layer in which the semiconductor is present.

Due to the extremely thin transistor body and nature of planar structures, all typical through-the-body stress elements, such as embedded SiGe source/drain and dual stress liner (DSL) don't generate high effective stress. resulting in lower drive current and degraded performance. It is with respect to these and other drawbacks of the current art that the present disclosure is provided to generate high stress to the transistor body.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device stack comprising a buried oxide (BOX) layer in a substrate, patterning a hardmask over the substrate, and forming a plurality of isolation regions in the device stack, wherein the plurality of isolation regions extend through the box layer and the substrate. The method may further include forming a well mask over the device stack, wherein an opening through the well mask exposes a first isolation region of the plurality of isolation regions, and modifying a stress of a material of the first isolation region by implanting the first isolation region of the plurality of isolation regions.

In another aspect, a method of forming a plurality of isolation regions in a silicon-on-insulator (SOI) device may include providing a device stack comprising a buried oxide (BOX) layer in a substrate, patterning a hardmask over the substrate, and forming the plurality of isolation regions in the device stack, wherein the plurality of isolation regions extend through the box layer and the substrate. The method may further include forming a well mask over the device stack, wherein an opening through the well mask exposes a first set of isolation regions of the plurality of isolation regions, and modifying a stress of a material of the first set of isolation region by implanting ions into the first isolation region of the plurality of isolation regions, wherein a second set of isolation regions of the plurality of isolation regions is not impacted by the implanted ions.

In yet another aspect, a method of forming an extra thin silicon-on-insulator (ETSOI) device may include providing a device stack comprising a buried oxide (BOX) layer in a silicon substrate, patterning a hardmask over the silicon substrate, and forming a plurality of isolation regions in the device stack, wherein the plurality of isolation regions extend through the box layer and the silicon substrate. The method may further include forming a well mask over the device stack, wherein an opening through the well mask exposes a first isolation region of the plurality of isolation regions, and modifying a stress of a material of the first isolation region by implanting the first isolation region of the plurality of isolation regions.

BRIEF DESCRIPTION OF THE DRAWINGS

The accompanying drawings illustrate exemplary approaches of the disclosure, including the practical application of the principles thereof, as follows.

Figure 1:
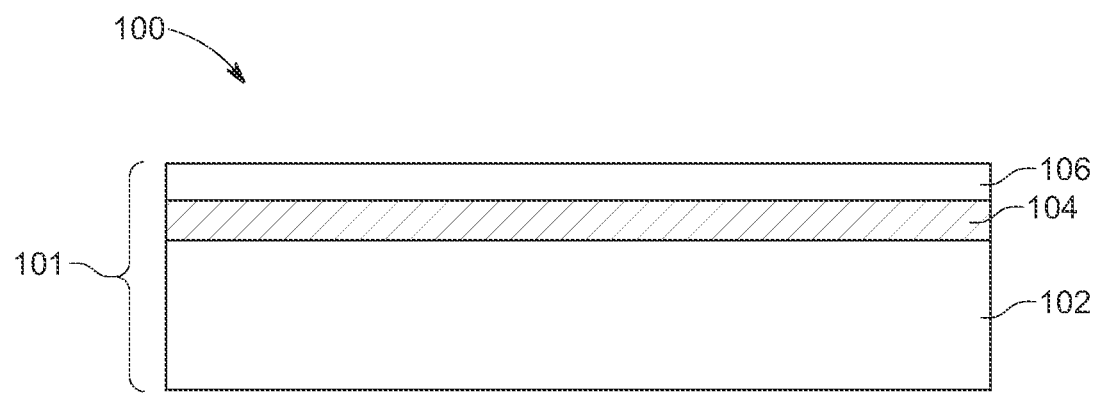
FIG. 1 is a cross-sectional side view of layers of a device, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, embodiments of the present disclosure improve SOI transistor performance by optimizing different stresses (e.g., tensile and compressive) for NMOS and PMOS. To accomplish this, selective implantation (e.g., multiple species at different energies and temperatures) into shallow trench isolation (STI) regions of both NMOS/PMOS may be performed to improve device performance. Advantageously, the implantation may be performed without adding new masks.

FIG. 1 is a side cross-sectional view of a portion of semiconductor device (hereinafter "device") 100, such as an extra-thin silicon on insulator (ETSOI) device, according to one or more embodiments. As shown, the device 100 may include a stack of layers 101 including, but not limited to, a silicon substrate 102, a buried oxide (BOX) layer 104 formed atop the silicon substrate 102, and a SOI layer 106 formed over the BOX layer 104. In various embodiments, the BOX layer 104 may be SiO2, while the SOI layer 106 may be an extra thin layer of Si. Embodiments herein are not limited in this context, however.

Figure 2:
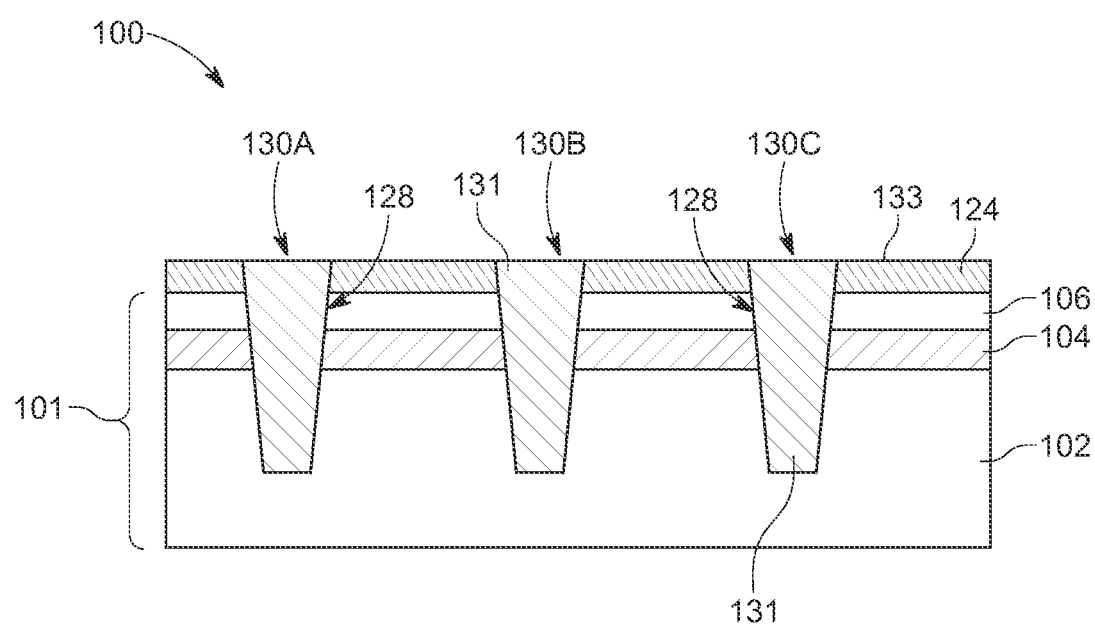
FIG. 2 is a side cross-sectional view illustrating the device following formation of a hardmask and a plurality of isolation regions, according to embodiments of the present disclosure.

Next, as shown in FIG. 2, a hardmask 124 may be formed over the SOI layer 106, and a plurality of openings may be patterned through the hardmask 124 to expose the SOI layer 106. Although non-limiting, the hardmask 124 may be SiN. A plurality of trenches 128 may be formed (e.g., etched) through the stack of layers 101, including through the SOI layer 106, the BOX layer 104, and the silicon substrate 102. The trenches 128 may then be filled with a material (e.g., SiO2) 131 to form a plurality of isolation regions 130A-130C in the device 100. In some embodiments, the material 131 may be formed within the trenches 128 using a flowable chemical vapor deposition process. Other deposition approaches may be used, however. The material 131 may then be planarized to a top surface 133 of the hardmask 124.

Figure 3:
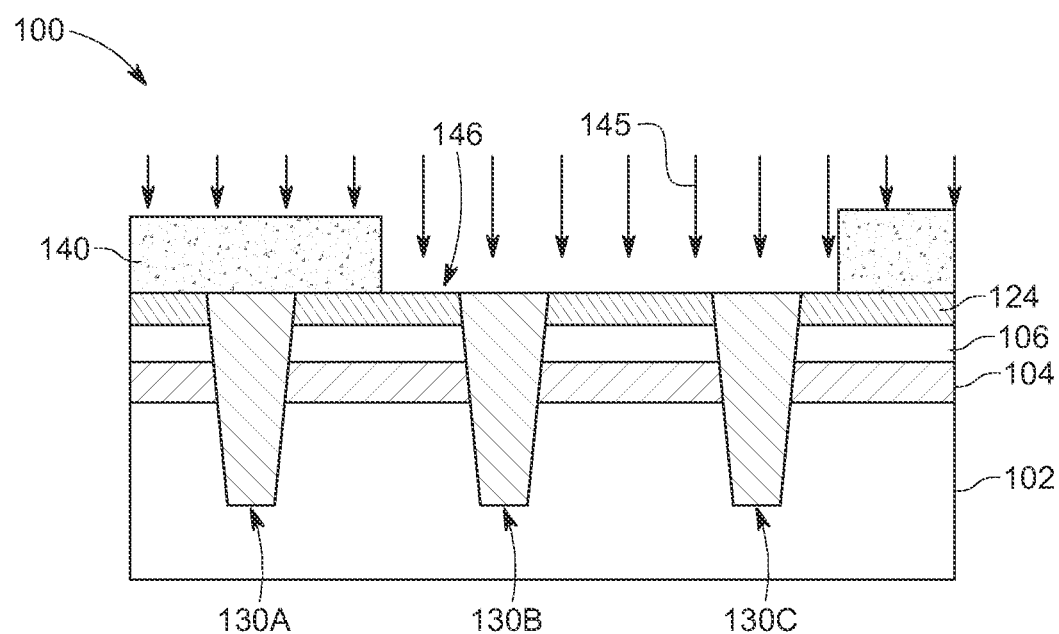
FIG. 3 is a side cross-sectional view illustrating the device during an implant process, according to embodiments of the present disclosure.

Next, as shown in FIG. 3, a well mask 140 may be formed over the hardmask 124, and an ion implant 145 may be delivered to the device 100. As shown, an opening 146 may be formed through the well mask 140 such that some, but not all of the isolation regions 130A-130C are covered by the well mask 140. More specifically, isolation region 130A is covered by the well mask 140, while isolation regions 130B and 130C are exposed within the opening 146. As a result, the ion implant 145 may impact isolation regions 130B and 130C without impacting isolation region 130A.

In various embodiments, the well mask 140 is an N-well mask, and the ion implant 145 delivers silicon ions through the opening 146 at a room temperature (e.g., 15-25° C.) to generate a tensile stress in the material 131 of isolation regions 130B and 130C. In other embodiments, the well mask 140 is a P-well mask, and the ion implant 145 delivers silicon ions through the opening 146 at a high-temperature (e.g., greater than 100° C.) to generate a compressive stress in the material 131 of isolation regions 130B and 130C. Although not shown, the device 100 may be supported by a substrate holder (e.g., electrostatic chuck or platen), which is maintained at the high temperature. In various other embodiments, implanting isolation regions 130B and 130C includes delivering one or more of the following ion species through the opening 146 of the well mask 140: silicon, carbon, nitrogen, fluorine, and helium.

Figure 4:
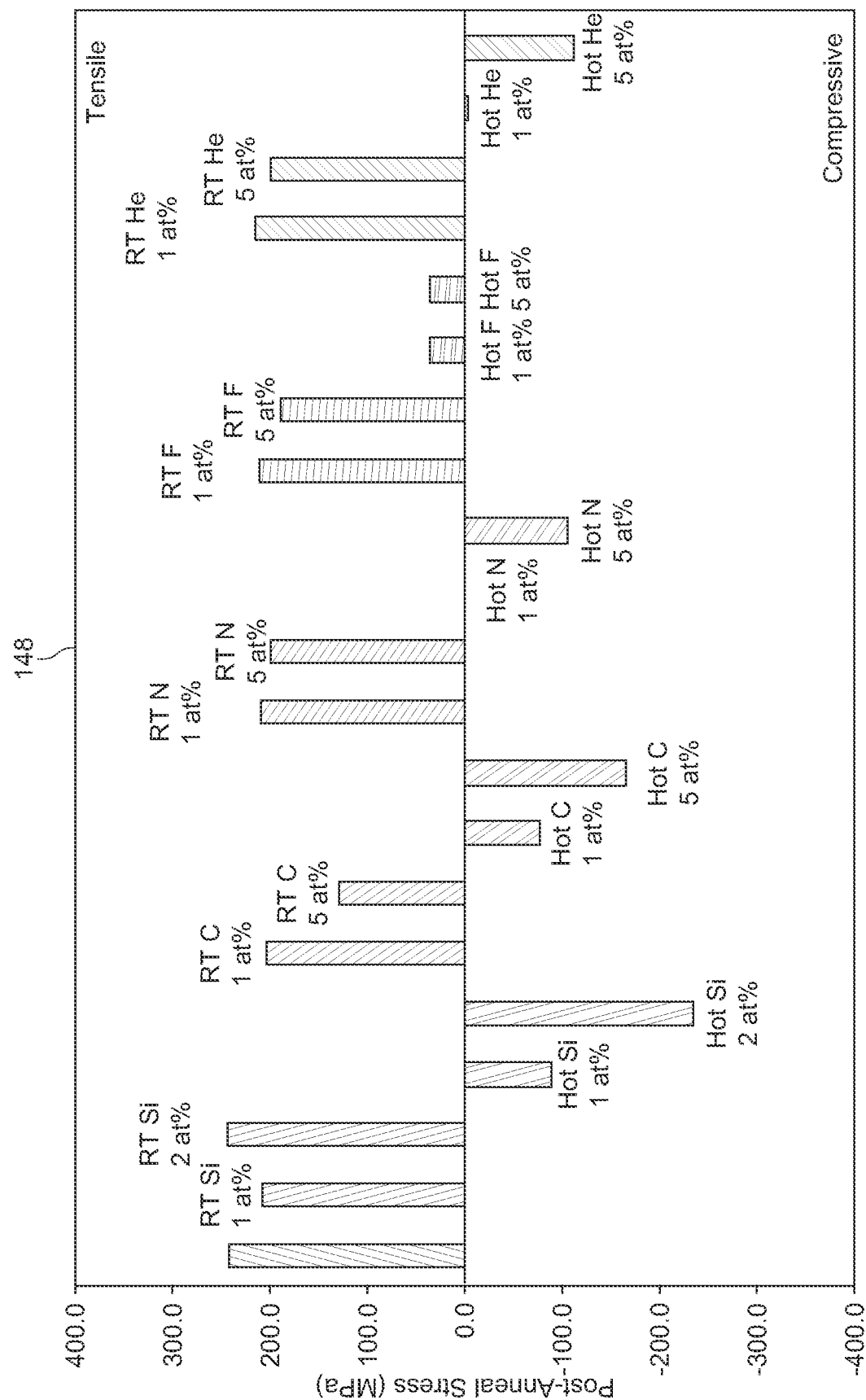
FIG. 4 is a chart demonstrating various post annealing stress values for an ion implant, according to embodiments of the present disclosure.

FIG. 4 is a chart 148 demonstrating example post annealing stress values for the material 131 of isolation regions 130B and 130C as a result of the ion implant 145. As demonstrated, room-temperature ion implants generate tensile stresses in the material 131, while high-temperature ion implants generate compressive stresses in the material 131. It will be appreciated that other ion species may be used, and that more than one ion species may be present in the ion implant 145, e.g., delivered over a series of success implant steps.

Figure 5:
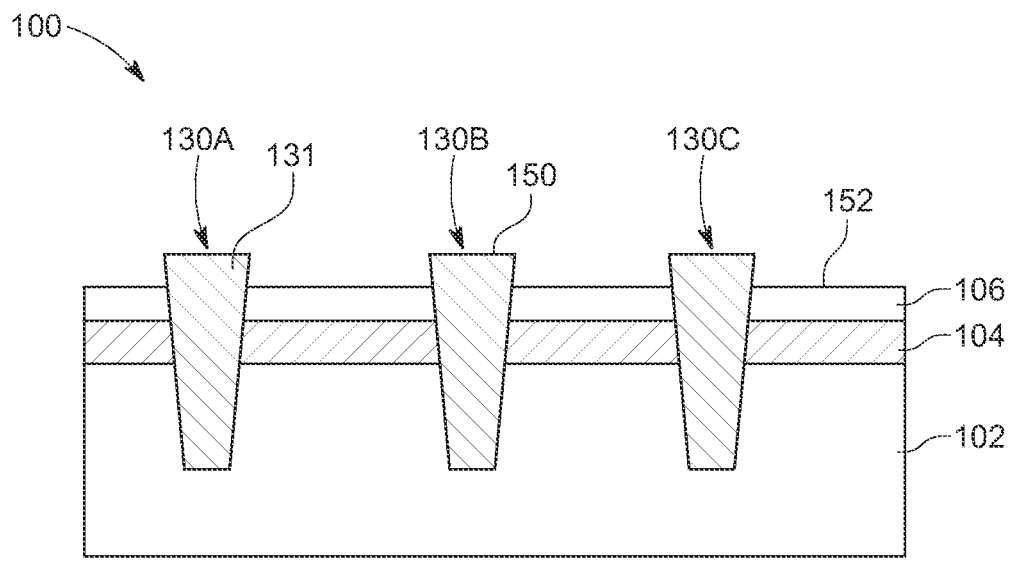
FIG. 5 is a side cross-sectional view illustrating the device following removal of the hardmask and a well mask, according to embodiments of the present disclosure.

FIG. 5 demonstrates the device 100 following removal of the hardmask 124 and the well mask 140. As shown, a plane defined by an upper surface 150 of the isolation regions 130A-130C may extend above an upper surface 152 of the SOI layer 106.

Figure 6:
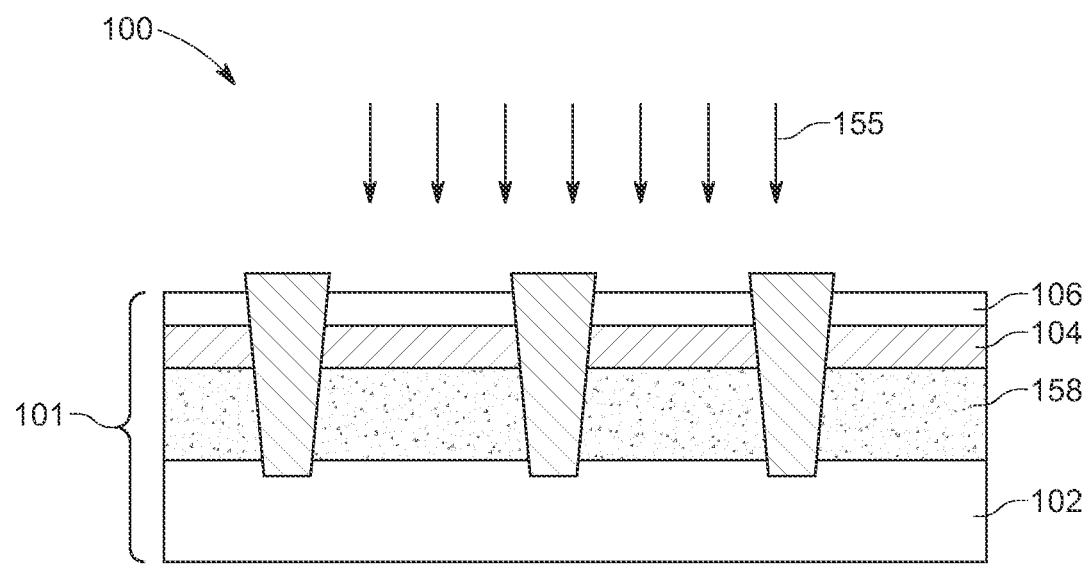
FIG. 6 is a side cross-sectional view illustrating formation of well regions within the device, according to embodiments of the present disclosure.

FIG. 6 demonstrates a well implant 155 is performed to form one or more wells 158 in the stack of layers 101 following removal of the hardmask 124 and the well mask 140. In some embodiments, the well implant 155 is created using photolithography to selectively define NFET and PFET areas for the wells 158, and then ions are implanted to form the wells 158. A p-type well is formed by implanting p-type species (such as B, $BF_2$, or In), while an n-type well is formed by implanting n-type species (such as As, P, or Sb). Although non-limiting, the energy of the implanted ions is selected to position their final distribution in the desired depth of the substrate 102. In one embodiment, the energy of the implanted ions for the well implant 155 is selected such that the peak of their distribution is positioned inside the SOI layer 106. Although not shown, an anneal may be performed after well implantation to heal the damage to the SOI layer 106 within the active area due to the ion implant. Alternatively, well implantation is skipped to create a completely undoped device. Although not shown, following the well implantation, a gate formation process may be carried out, as known.

Figure 7:
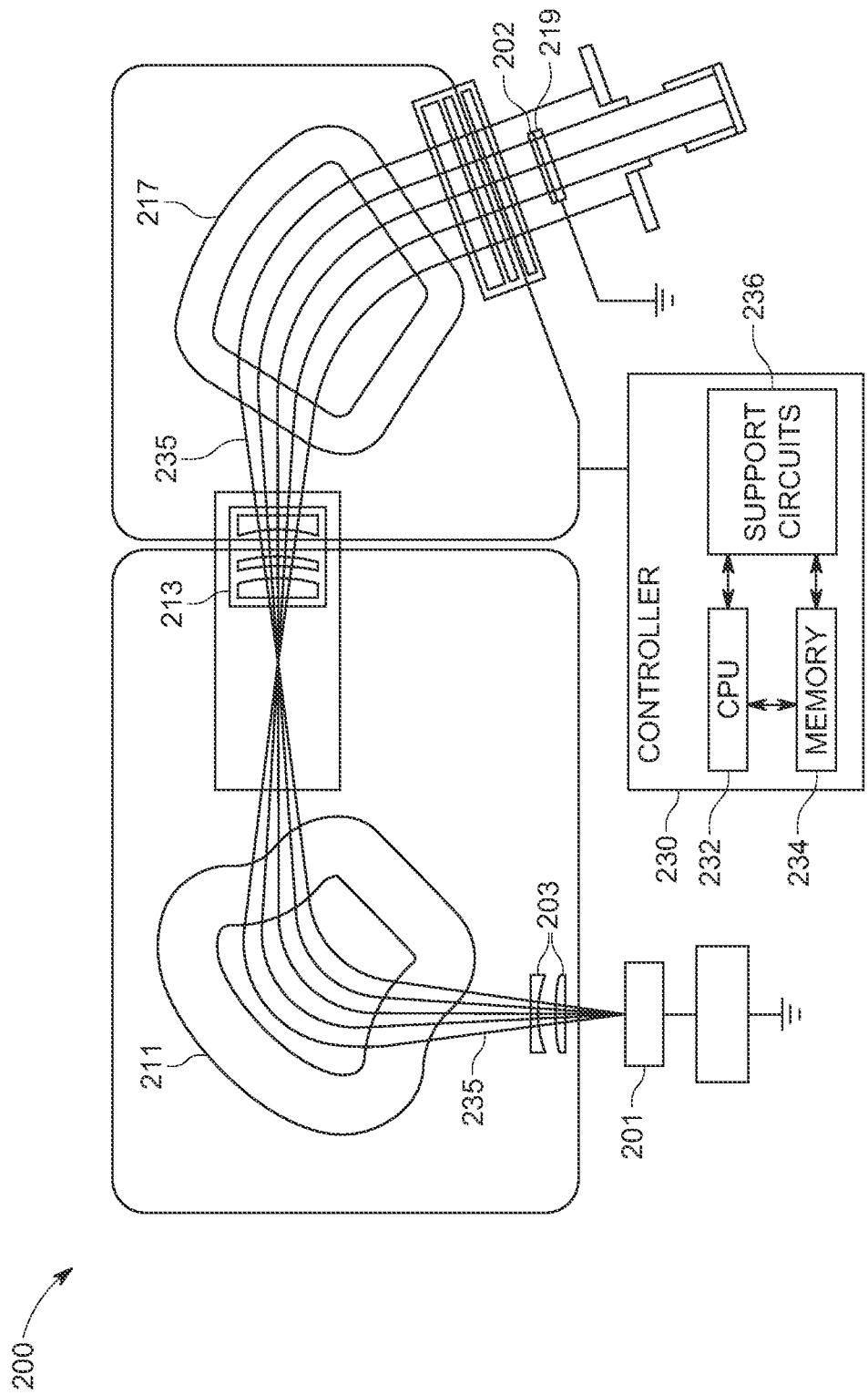
FIG. 7 illustrates a schematic diagram of a processing apparatus according to embodiments of the present disclosure.

FIG. 7 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide an ion implant, such as the ion implant 145 demonstrated in FIG. 2.

The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g., translate, rotate, tilt, etc.) by a component sometimes referred to as a platen, substrate holder, or "roplat" (not shown). It is also contemplated that the processing apparatus 200 may be configured to perform heated implantation processes to provide for improved control of implantation characteristics, such as the ion trajectory and implantation energy utilized to dope the substrate. In some cases, the platen is heated while the implantation process is performed.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
providing a device stack comprising a buried oxide (BOX) layer in a substrate;
patterning a hardmask over the substrate;
forming a plurality of isolation regions in the device stack, wherein the plurality of isolation regions extend through the BOX layer and the substrate;
forming a well mask over the device stack, wherein an opening through the well mask exposes a first isolation region of the plurality of isolation regions; and
modifying a stress of a material of the first isolation region by implanting the hardmask and the first isolation region of the plurality of isolation regions.

2. The method of claim 1, further comprising removing the well mask and the hardmask following the implantation of the first isolation region.

3. The method of claim 2, further comprising forming a well in the device stack after the well mask and the hardmask are removed.

4. The method of claim 1, wherein the well mask is an N-well mask, and wherein implanting the first isolation region comprises delivering silicon ions through the opening at a room temperature to generate a tensile stress in the material of the first isolation region.

5. The method of claim 1, wherein the well mask is a P-well mask, and wherein implanting the first isolation region comprises delivering silicon ions through the opening at a high-temperature to generate a compressive stress in the material of the first isolation region.

6. The method of claim 1, wherein forming the plurality of isolation regions comprises forming a silicon dioxide within a plurality of openings of the device stack using a flowable chemical vapor deposition process.

7. The method of claim 6, further comprising planarizing the silicon dioxide prior to forming the well mask over the device stack.

8. The method of claim 1, wherein implanting the first isolation region comprises delivering at least one of the following ion species through the opening of the well mask: silicon, carbon, nitrogen, fluorine, and helium.

9. A method of forming a plurality of isolation regions in a silicon-on-insulator (SOI) device, the method comprising:
providing a device stack comprising a buried oxide (BOX) layer in a substrate;
patterning a hardmask over the substrate;
forming the plurality of isolation regions in the device stack, wherein the plurality of isolation regions extend through the BOX layer and the substrate;
forming a well mask over the device stack, wherein an opening through the well mask exposes a first set of isolation regions of the plurality of isolation regions; and
modifying a stress of a material of the first set of isolation region by implanting ions into the hardmask and the first isolation region of the plurality of isolation regions, wherein a second set of isolation regions of the plurality of isolation regions is not impacted by the implanted ions.

10. The method of claim 9, further comprising:
removing the well mask and the hardmask following the implantation of the first isolation region; and
forming a well in the device stack after the well mask and the hardmask are removed.

11. The method of claim 9, wherein the well mask is an N-well mask, and wherein implanting the first isolation region comprises delivering silicon ions through the opening at a room temperature to generate a tensile stress in the material of the first isolation region.

12. The method of claim 9, wherein the well mask is a P-well mask, and wherein implanting the first isolation region comprises delivering silicon ions through the opening at a high-temperature to generate a compressive stress in the material of the first isolation region.

13. The method of claim 9, wherein forming the plurality of isolation regions comprises forming a silicon dioxide within a plurality of openings of the device stack using a flowable chemical vapor deposition process, and wherein the silicon dioxide is planarized prior to forming the well mask over the device stack.

14. The method of claim 9, wherein implanting the first isolation region comprises delivering at least one of the following ion species through the opening of the well mask: silicon, carbon, nitrogen, fluorine, and helium.

15. A method of forming an extra thin silicon-on-insulator (ETSOI) device, the method comprising:
providing a device stack comprising a buried oxide (BOX) layer in a silicon substrate;
patterning a hardmask over the silicon substrate;
forming a plurality of isolation regions in the device stack, wherein the plurality of isolation regions extend through the BOX layer and the silicon substrate;
forming a well mask over the device stack, wherein an opening through the well mask exposes a first isolation region of the plurality of isolation regions; and
modifying a stress of a material of the first isolation region by implanting the hardmask and the first isolation region of the plurality of isolation regions.

16. The method of claim 15, further comprising:
removing the well mask and the hardmask following the implantation of the first isolation region; and forming a well in the device stack after the well mask and the hardmask are removed.

17. The method of claim 15, wherein the well mask is an N-well mask, and wherein implanting the first isolation region comprises delivering silicon ions through the opening at a room temperature to generate a tensile stress in the material of the first isolation region.

18. The method of claim 15, wherein the well mask is a P-well mask, and wherein implanting the first isolation region comprises delivering silicon ions through the opening at a high-temperature to generate a compressive stress in the material of the first isolation region.

19. The method of claim 15, wherein forming the plurality of isolation regions comprises forming a silicon dioxide within a plurality of openings of the device stack using a flowable chemical vapor deposition process, and wherein the silicon dioxide is planarized prior to forming the well mask over the device stack.

20. The method of claim 15, wherein implanting the first isolation region comprises delivering at least one of the following ion species through the opening of the well mask: silicon, carbon, nitrogen, fluorine, and helium, and wherein the ion species may be delivered through the opening of the well mask while a substrate holder supporting the device stack is maintained at a high temperature.

* * * * *